(12) United States Patent
Elias et al.

(10) Patent No.: US 9,509,292 B2
(45) Date of Patent: Nov. 29, 2016

(54) METHOD AND APPARATUS FOR IMPROVING A LOAD INDEPENDENT BUFFER

(75) Inventors: Vinu K. Elias, Austin, TX (US); Chih-Liang Leon Huang, Austin, TX (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 13/991,881

(22) PCT Filed: Sep. 29, 2011

(86) PCT No.: PCT/US2011/053990
§ 371 (c)(1),
(2), (4) Date: Jun. 5, 2013

(87) PCT Pub. No.: WO2013/048410
PCT Pub. Date: Apr. 4, 2013

(65) Prior Publication Data
US 2013/0249603 A1  Sep. 26, 2013

(51) Int. Cl.
| *H03K 3/00* | (2006.01) |
| *H03K 5/00* | (2006.01) |
| *H03K 19/0185* | (2006.01) |
| *H03K 19/0948* | (2006.01) |

(52) U.S. Cl.
CPC ........ *H03K 5/00* (2013.01); *H03K 19/018578* (2013.01); *H03K 19/09482* (2013.01)

(58) Field of Classification Search
USPC ........................................................ 327/108
See application file for complete search history.

(56) References Cited

U.S. PATENT DOCUMENTS

| 5,808,481 A * | 9/1998 | Thompson ...................... 326/83 |
| 5,841,957 A * | 11/1998 | Ju et al. ...................... 714/6.13 |
| 5,949,259 A | 9/1999 | Garcia |
| 6,404,376 B1 * | 6/2002 | Kalthoff et al. .............. 341/172 |
| 7,652,511 B2 | 1/2010 | Chuang et al. |

(Continued)

FOREIGN PATENT DOCUMENTS

| EP | 2057735 | 5/2009 |
| JP | 02166915 A | 6/1990 |

(Continued)

OTHER PUBLICATIONS

Notification Concerning Transmittal of International Preliminary Report on Patentability issued for PCT International Patent Application No. PCT/US2011/053990, mailed Apr. 10, 2014, 6 pages.
International Search Report & Written Opinion mailed Feb. 24, 2012 for International Patent Application No. PCT/US2011/053990.
First Office Action mailed on Jan. 14, 2013 for Chinese Patent Application No. 201220509930.6, 4 pages.

(Continued)

*Primary Examiner* — Lincoln Donovan
*Assistant Examiner* — Patrick Chen
(74) *Attorney, Agent, or Firm* — Green, Howard & Mughal, LLP

(57) ABSTRACT

Described herein are apparatus, system, and method for reducing electrical over-stress of transistors and for generating an output with deterministic duty cycle for load independent buffers. The apparatus comprises a feedback capacitor electrically coupled between an input terminal and an output terminal of a buffer; and a switch, electrically parallel to the feedback capacitor and operable to electrically short the feedback capacitor in response to a control signal, wherein the switch causes a deterministic voltage level on the input terminal.

16 Claims, 7 Drawing Sheets

(56) References Cited

U.S. PATENT DOCUMENTS

| | | | |
|---|---|---|---|
| 2003/0122617 | A1 | 7/2003 | Johnston |
| 2006/0145734 | A1 | 7/2006 | Abdel-Hamid et al. |
| 2006/0262621 | A1* | 11/2006 | Forbes ................ G11C 11/4091 365/205 |
| 2007/0273699 | A1* | 11/2007 | Sasaki et al. ................ 345/502 |
| 2010/0058087 | A1* | 3/2010 | Borras et al. ................ 713/322 |
| 2010/0244907 | A1 | 9/2010 | Gagne et al. |
| 2012/0032706 | A1* | 2/2012 | Kim ................ H03K 19/00346 327/108 |
| 2012/0212260 | A1 | 8/2012 | Chen et al. |
| 2013/0162304 | A1 | 6/2013 | Kim |

FOREIGN PATENT DOCUMENTS

| | | | |
|---|---|---|---|
| JP | 06296129 A | 10/1994 | |
| JP | 07-093441 | 7/1995 | |
| JP | 2001508635 A | 6/2001 | |
| JP | 2004527943 A | 9/2004 | |
| JP | 2004527973 A | 9/2004 | |
| JP | 2005057744 A | 3/2005 | |
| JP | 2007081907 A | 3/2007 | |
| JP | 2009290439 A | 12/2009 | |
| KR | 1020000070254 | 11/2000 | |
| WO | 02095531 A2 | 11/2002 | |

OTHER PUBLICATIONS

First Office Action issued for Chinese Patent Application No. 201220509930.6, mailed May 17, 2013.
Office Action from related Chinese Patent Application No. 201220509930.6, mailed Jan. 14, 2013, 4 pages, English translation included.
First Office Action from related Chinese Patent Application No. 201220509930.6, mailed May 7, 2013, 4 pages, English translation included.
Notice Of Granting Patent Right for Utility Model, Patent Application No. 201220509930.6, mailed Aug. 9, 2013, 7 pages, including English translation of the Grant and claims.
Notice of Allowance for Japanese Patent Application No. 2014-533258, issued on Feb. 23, 2016.
Notice of Allowance for Korean Patent Application No. 10-2014-7008363, issued on Apr. 15, 2016.
Notice of Allowance for Taiwan Patent Application No. 101130837, issued on Sep. 24, 2015.
Notice of Preliminary Rejection for Korean Patent Application No. 10-2014-7008363, issued on Oct. 13, 2015.
Office Action and Search Report for Taiwan Patent Application No. 101130837 mailed Apr. 28, 2015, 12 pages.
Office Action for Japanese Patent Application No. 2014-533258 mailed Jul. 21, 2015, 6 pages.
Office Action, mailed Aug. 17, 2016, for Korean Patent Application No. 10-2016-7017777.

* cited by examiner

METHOD AND APPARATUS FOR IMPROVING A LOAD INDEPENDENT BUFFER

CLAIM OF PRIORITY

This application claims the benefit of priority of International Patent Application No. PCT/US2011/053990 filed Sep. 29, 2011, titled "METHOD AND APPARATUS FOR IMPROVING A LOAD INDEPENDENT BUFFER," which is incorporated by reference in its entirety.

FIELD OF THE INVENTION

Embodiments of the invention relate generally to the field of processors. More particularly, embodiments of the invention relate to apparatus, system, and method for improving a load independent buffer by reducing electrical over-stress of transistors of the buffer and generating an output with deterministic duty cycle for load independent buffers.

BACKGROUND

FIG. 1 illustrates a prior art slew rate controlled output buffer 100 with a feedback capacitor CF between the nodes Vo and Vf. Node Vo represents an external input-output (I/O) pad, where CL is the load capacitance on the node Vo. Transistors P1 and N1 represent a driver of the output buffer 100. Transistors P3, N3 and P2, N2 represent pre-drivers to the driver transistors P1 and N1, respectively, and drive an input signal Vi to the driver. Transistors P4 and N4 are part of the feedback network that theoretically allow the slew rate of the buffer at node Vo to depend on the feedback capacitor CF and the switch current generated by transistors P1 and N1. The term "transistors" and "devices" herein are interchangeably used.

The term "slew rate" herein refers to rise and fall times of signals at the node Vo measured from voltage points 10-20% (for example) above the low signal level and voltage points 10-20% (for example) below the high signal level of the signal on node Vo.

However, the slew rate controlled output buffer 100 of FIG. 1 suffers from transistor reliability issues for transistors P4 and N4, where the reliability issues are caused by an overshoot of voltage on the node Vf. For example, consider an operating condition of the buffer 100 when the node Vf is initially at its highest possible voltage of Vcc-Vtp, where Vcc is the power supply level and where Vtp is the threshold voltage of transistor P4. Continuing with the same example, consider that the output buffer receive mode, i.e. transistors P4, N4, P1, and N1, are all off. Due to electric coupling across nodes of the feedback capacitor CF, the node Vf will charge up as the pad voltage on the node Vo switches/transitions. As the node Vf charges up, the transistor P4 will eventually turn on and cause the node Vf to stabilize to a Vcc+|Vtp| level. When the node Vf is charging up and the node Vo (also referred to as the pad) switches from a logical low level to a logical high level, the node Vf will experience a strong coupling from the pad causing an overshoot voltage on node Vf to be much higher than Vcc+|Vtp| level.

This overshoot voltage causes electrical overstress on devices P4 and N4, thus aging those devices faster than other devices of the buffer 100. The overshoot voltage may also be caused by any mismatch in the number of transistors of P1 and N1 turned on. These overshoots will eventually cause the buffer to malfunction because the devices P4 and N4 will be damaged by the overshoots on node Vf. The overshoot on node Vf further causes duty cycle uncertainty on the first signal transition during transmit mode of the buffer 100.

BRIEF DESCRIPTION OF THE DRAWINGS

Embodiments of the invention will be understood more fully from the detailed description given below and from the accompanying drawings of various embodiments of the invention, which, however, should not be taken to limit the invention to the specific embodiments, but are for explanation and understanding only.

SUMMARY

Embodiments of the invention relate to an apparatus, system, and method for reducing electrical over-stress of transistors and for generating an output with deterministic duty cycle for load independent buffers. In one embodiment, the apparatus comprises a feedback capacitor electrically coupled between an input terminal and an output terminal of a buffer; and a switch, electrically parallel to the feedback capacitor and operable to electrically short the feedback capacitor in response to a control signal, wherein the switch to cause a deterministic voltage level on the input terminal.

In one embodiment, the system comprises an embedded multimedia card (eMMC) unit; and a processor with an input-output (I/O) interface coupled to the eMMC unit, the I/O interface comprising: a feedback capacitor electrically coupled between an input terminal and an output terminal of a buffer; and a switch, electrically parallel to the feedback capacitor and operable to electrically short the feedback capacitor in response to a control signal, wherein the switch to cause a deterministic voltage level on the input terminal.

In one embodiment, the method comprises electrically coupling a feedback capacitor between an input terminal and an output terminal of a buffer; and electrically shorting by a switch in response to a control signal, wherein the switch is electrically parallel to the feedback capacitor, and wherein the switch causes a deterministic voltage level on the input terminal.

DETAILED DESCRIPTION

Embodiments of the invention relate to an apparatus, system, and method for reducing electrical over-stress of transistors and for generating an output with deterministic duty cycle for load independent buffers. The term "load independent buffer" herein refers to a buffer which can provide a substantially constant slew rate at its output node for a wide range of load capacitances. The term "substantially constant" herein refers to being within 10-20% of the value. The buffer 100 of FIG. 1 theoretically provides a constant slew rate at its output, but at the cost of irregular aging of internal devices (P4, N4) and in-deterministic duty cycle at the output node Vo of the buffer, etc. The term "aging" herein refers to degradation overtime of transistor characteristics caused by physical changes in the transistor components.

Figure 1:
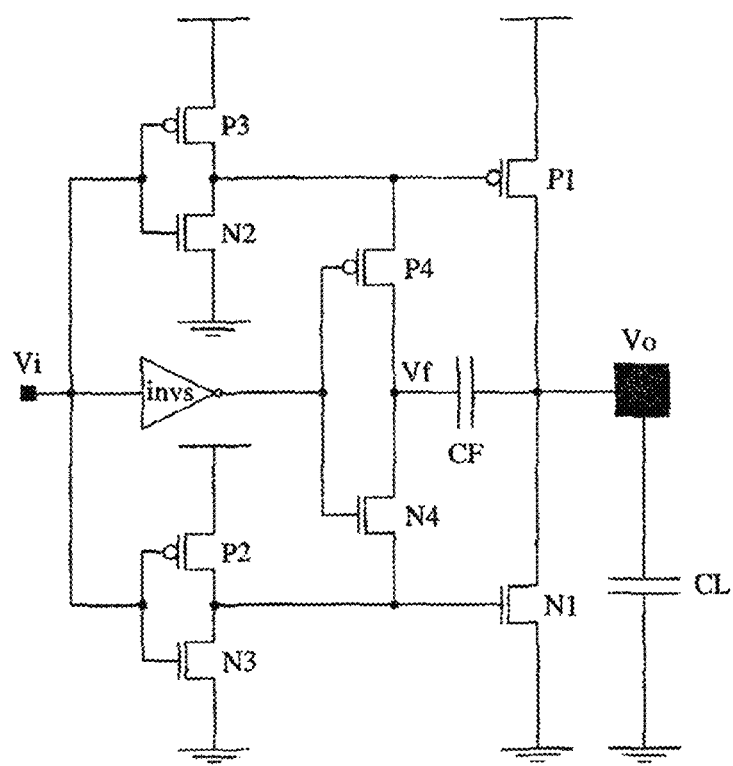
FIG. 1 is a prior art slew rate controlled output buffer that suffers from electrical overstress of internal transistors and non-deterministic duty cycle at the output.

With reference to FIG. 1, in one embodiment a switch is positioned between the nodes Vo and Vf to provide a low resistance shunt path to bypass the feedback capacitor CF. In such an embodiment, the internal node Vf has a deterministic voltage level when the switch is turned on which is not possible in the prior art buffer 100 of FIG. 1. In one embodiment, the switch is operable to adjust the amount of feedback capacitance CF. In such an embodiment, the feedback capacitor CF comprises a plurality of capacitors and the switch comprises a plurality of switches such that each switch of the plurality of switches is operable to turn on/off a corresponding feedback CF of the plurality of feedback capacitors. In one embodiment, the switch(es) provides the flexibility to compensate the feedback capacitor CF for capacitance variations, caused by process technology skews or variations, by turning on/off certain number of feedback capacitors from the plurality of feedback capacitors.

The technical effect of the embodiments discussed herein is to provide an improved load independent buffer which does not exhibit any electrical stress on internal transistors such as P4 and N4, provides a constant slew rate on node Vo over a large range of load capacitances CL on node Vo, removes any initial indeterminism to the duty cycle of the signal driven out by the buffer on node Vo, and allows for a single buffer design to be used for multiple I/O buffer configurations.

In one embodiment, the load independent buffer discussed herein with reference to FIGS. 1-5 is used as I/O buffer to communicate with a solid state drive (SSD) having NAND flash memory, and can also be used to communicate with an embedded multimedia card (eMMC), where both types of I/O interfaces for the SSD and eMMC have very different output slew rate specifications because of different loads on their outputs. The load independent buffer discussed with reference to the embodiments herein can be used in smart phones, PC tablets, digital cameras and other consumer electronics even though these devices may have different load capacitances for their I/Os.

In the following description, numerous details are discussed to provide a more thorough explanation of embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

In the following description and claims, the term "coupled" and its derivatives may be used. The term "coupled" herein refers to two or more elements which are in direct contact (physically, electrically, magnetically, optically, etc.). The term "coupled" herein may also refer to two or more elements that are not in direct contact with each other, but still cooperate or interact with each other.

As used herein, unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

Figure 2A:
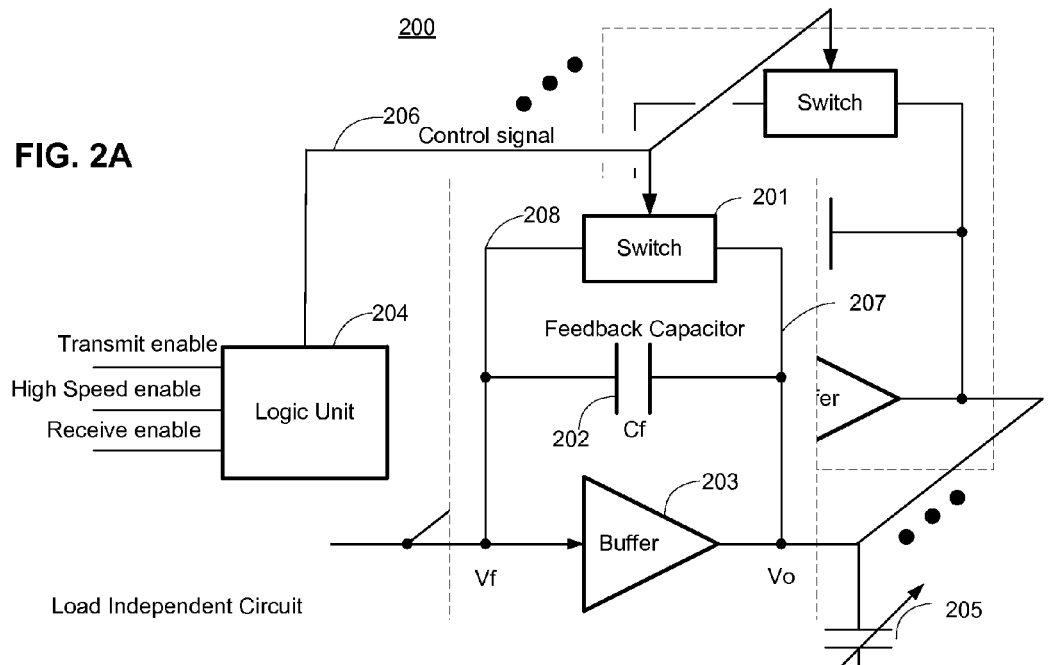
FIGS. 2A and 2B show a high level circuit diagram of an improved load independent buffer, according to one embodiment of the invention.
Figure 2B:
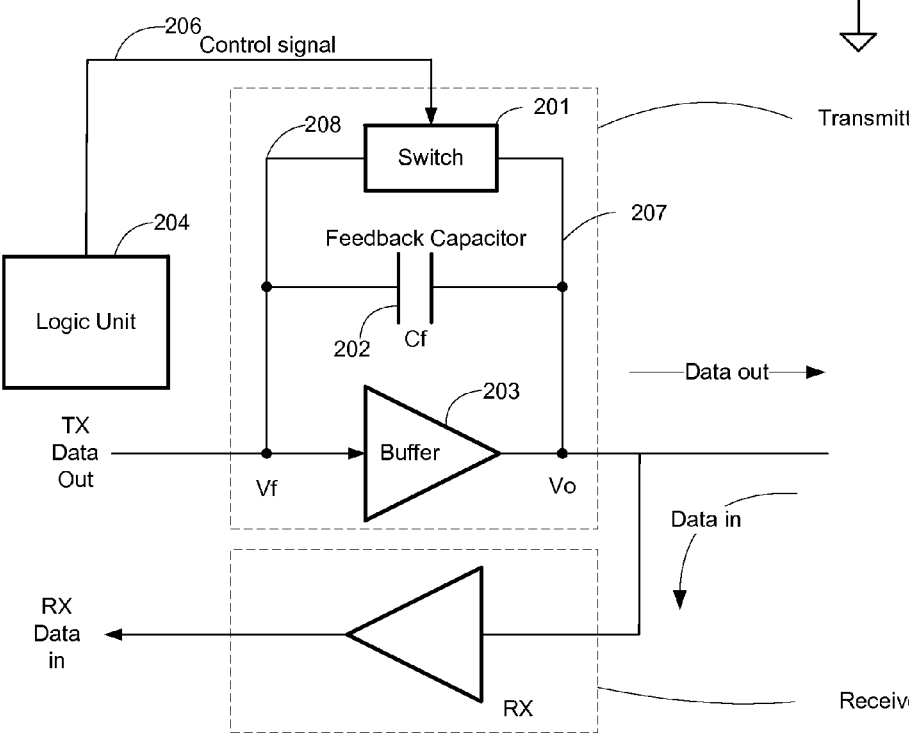

FIG. 2 is a high level circuit for a load independent buffer 200, according to one embodiment of the invention. The load independent buffer 200 of FIG. 2 is an improved version of the buffer 100 of FIG. 1. The embodiments of the load independent buffer 200 are described with reference to the buffer 100 of FIG. 1.

In one embodiment, a feedback capacitor 202 is positioned between the input 208 and output 207 nodes of a buffer 203 such that the feedback capacitor 202 is in parallel to the buffer 203. In one embodiment, the feedback capacitor 202 is coupled to a P-transistor (e.g., P4 of FIG. 1), the P-transistor coupled to a gate of a pull-up device (e.g., P1 of FIG. 1) of the buffer 203. In one embodiment, the feedback capacitor 202 is coupled to an N-transistor (e.g., N4 of FIG. 1), where the N-transistor is coupled to a gate of a pull-down device N1 of the buffer. In one embodiment, the input terminal 208 Vf couples to a source or drain terminal of the P-transistor P4 and the N-transistor N4 while the output terminal 207 Vo couples to a load 205.

In one embodiment, the feedback capacitor 202 is a distributed capacitor, i.e., the feedback capacitor 202 is divided into multiple smaller capacitors associated with different groups of buffers 203. In one embodiment, the feedback capacitor 202 is a distributed equally between groups of buffers 203. In one embodiment, the feedback capacitor 202 is distributed as thermometer weighted capacitors. In one embodiment, the feedback capacitor 202 is distributed as binary weighted capacitors.

In one embodiment, the buffer 203 comprises a plurality of drivers (plurality of P1 and N1 transistors of FIG. 1) of an input-output (I/O) transmitter, and wherein the feedback capacitor 202 comprises a plurality of feedback capacitors (i.e., distributed feedback capacitor 202) coupled between the input 208 and output 207 terminals of the buffer 203. In one embodiment, the feedback capacitor 202 is distributed equally between the plurality of drivers of the buffer 203. In one embodiment, the feedback capacitor 202 is distributed such that the first five least significant bits (LSBs) of the driver pull-up transistors P1 and the pull-down transistors N1 couple to one half of the feedback capacitor 202, the next second five LSBs of the driver pull-up transistors P1 and the pull-down transistors N couple to one third of the feedback capacitor 202, and the most significant bits (MSBs) of the driver pull-up transistors P1 and the pull-down transistors N1 couple to one sixth of the feedback capacitor 202.

In one embodiment, a switch 201 is positioned in parallel to the feedback capacitor 202 so that it electrically couples the nodes 208 and 207. In such an embodiment, the switch 201 is controlled by a control signal 206 to control when the switch 201 turns on to electrically short the nodes 207 and 208 thus shorting the feedback capacitor 202. The control signal 206 also controls when the switch 201 turns off to provide an open circuit between nodes 207 and 208 to enable the function of the feedback capacitor 202. Reference to the control signal 206 being able to control the switch 201 means that a certain voltage or current level of the control signal 206 causes the switch 201 to turn on or off. In one embodiment, the switch 201 is a pass gate transistor comprising PMOS and NMOS transistors. In another embodiment, the switch 201 is only one of a PMOS or an NMOS transistor. In other embodiments, other forms of switch designs may be used that can short nodes 208 and 207 to one another. In one embodiment, when the control signal 206 causes the switch to turn on, i.e. electrically short the feedback capacitor 202, a deterministic voltage level on the input terminal 208 is achieved. In one embodiment, the voltage level of the control signal 206 causes the switch to turn on for initial data transfer from the buffer 203.

In one embodiment, the switch 201 comprises a plurality of switches (distributed switches), each of which is electrically parallel to a corresponding feedback capacitor of the plurality of feedback capacitors (i.e., distributed feedback capacitor 202), wherein the control signal 206 comprises a plurality of control signals (e.g., a bus), and wherein each control signal of the plurality of control signals to cause a corresponding switch from the plurality of switches to turn on or off according to a signal level of that control signal.

In one embodiment, the control signal 206 is generated by a logic unit 204. The logic unit 204 is operable to monitor various factors to decide when to assert or de-assert the control signal 206 i.e., when to turn on or off the switch 201. In one embodiment, the factors include whether the buffer 203 is in drive mode (if in drive mode, the switch is turned on otherwise it is turned off), whether a receiver (not shown) coupled to the node 208 is in receive mode (if in receive mode the switch is turned on otherwise it is turned off), whether there is a mismatch in a number of legs of transistors P1 and N1 turned on (the switch is turned on for the mismatched leg otherwise it is turned off), whether the buffer 203 is operable to drive at a higher slew rate i.e., by-pass the feedback capacitor 202 (the switch is turned off).

In one embodiment, the value of the feedback capacitor 202 is 3 pF. In one embodiment, the load independent buffer 200 is operable to provide a slew rate of 3V/ns to 7V/ns for load capacitance ranging from 1 pF to 30 pF without causing any stress on transistors connected to the feedback capacitor 202 at node 208.

Figure 3:
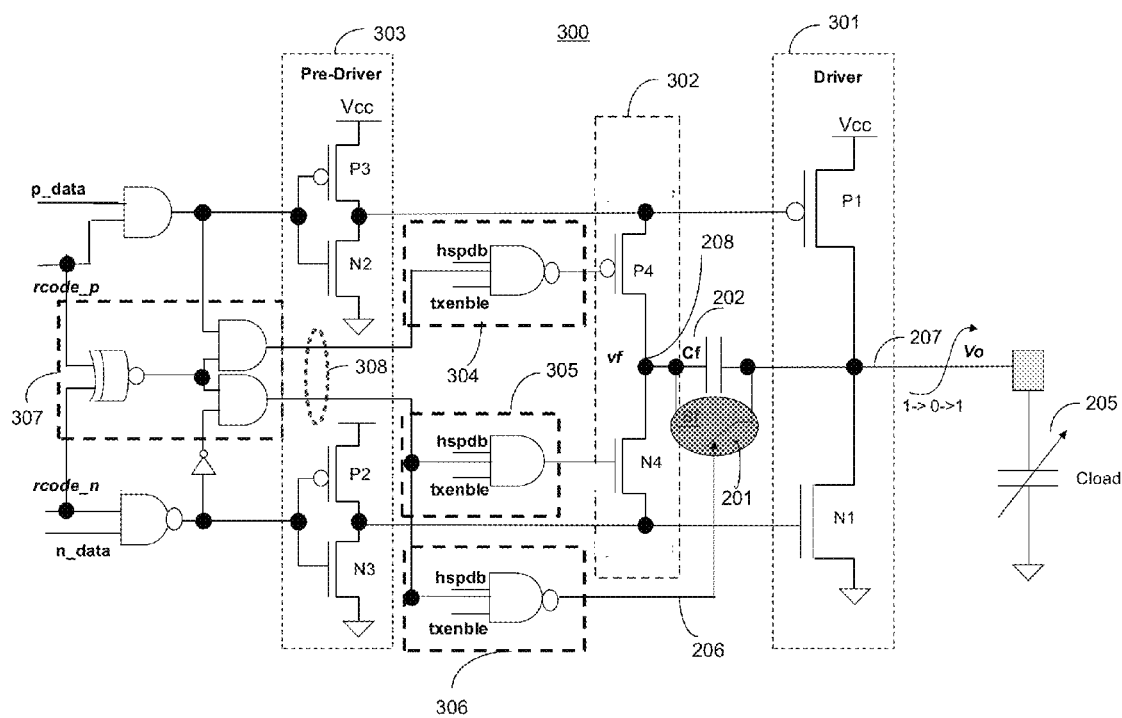
FIG. 3 is a circuit for improving the load independent buffer, according to one embodiment of the invention.

FIG. 3 is a circuit level view of a load independent buffer 300/200, according to one embodiment of the invention. FIG. 3 is described with reference to FIGS. 1-2. The transistor names of FIG. 3 and FIG. 1 are labeled the same to highlight the differences between FIG. 1 and FIG. 3 and so as not to obscure the embodiments of the invention. In one embodiment, the buffer 203 comprises a driver 301 that drives a signal on the output node Vo 207 based on the input signals p_data and n_data. In one embodiment, the buffer 203 comprises a pre-driver 303 with transistors P2, P3, N2, and N3 to drive the driver 301.

The load on the node 207 Vo is represented by a load capacitor 205 (Cload). The arrow on the load capacitor 205 represents that the load capacitor 205 has variable capacitance. In one embodiment, the load independent buffer 300/200 comprises logic units 304 and 305 to control when to turn on/off the transistors 302 (P4 and N4) that couple to the driver 301 and the feedback capacitor 202. In one embodiment, the load independent buffer 300/200 comprises logic unit 307 to generate signals 308 to control when to turn on/off the transistors P4 and N4 and the switch 201.

As mentioned above with reference to FIG. 2, in one embodiment the switch 201 comprises a plurality of switches (not shown), each of which is positioned to be in parallel to a corresponding feedback capacitor of a plurality of feedback capacitors. In one embodiment, each switch of the plurality of switches is coupled to pull-up P1 and pull-down N1 transistors of the driver 301 of the load independent buffer 300. In one embodiment, the logic units 307 and 306 are operable to turn on or off a switch from the plurality of switches in response to determining a difference in a number of the pull-up P1 and pull-down N1 transistors turned on or off.

In one embodiment, when the driver 301 is not driving any data, i.e. it is disabled (txenable is logically low), or when the driver 301 is operable to drive a signal with a slew rate higher than normal slew rate (hspdp is logically low), or when there is difference (i.e., rcode_n and rcode_p mismatch) in a number (indicated by signal 308) of the pull-up P1 and pull-down N1 transistors turned on or off, then the logic units 304 and 305 turn off the transistors P4 and N4. In such an embodiment, the logic unit 306 generates a control signal 206 to enable the switch 201 such that the switch 201 turns on and shorts the nodes 207 and 208 to one another. In one embodiment, the logic units 304, 305, 306, and 307 form the logic unit 204 of FIG. 2.

In one embodiment, enabling the switch 201 (i.e., turning it on to electrically short the node 207 with node 208) ensures that the node 208 Vf will follow the pad voltage at node 207 Vo and will not exceed Vcc power supply level. In such an embodiment, electrical overstress on devices P4 and N4 is avoided.

A person skilled in the art would appreciate that the electrical performance of a P-transistor and an N-transistor are generally not uniform (due to process, temperature, voltage variations). This non-uniformity may result in an unbalanced RCODE (impedance code of the driver 301) between the pull-up P1 and the pull-down N1 transistors for the driver 301 when impedance calibration/compensation is performed.

The following example is presented with reference to prior art FIG. 1 to show the technical effect of the switch 201 with regards to unbalanced impedance codes of the driver transistors P1 and N1 of the buffer 100. Consider a case without the switch 201 (e.g., as shown in prior art FIG. 1) when the driver (P1 and N1) is implemented using a thermometer encoding scheme. Assume a case when the pull-up code from the driver is 1FFh, i.e. 1 higher than the pull-down code of FFh. This uniformity will force the pulldown leg 9 of the driver to be always turned off. Now further assume that the feedback capacitor CF is uniformly distributed across all the legs of the driver transistors P1 and N1. As the signal on the I/O pad Vo switches between logical high level and logical low level, the internal node Vf will toggle between Vtp (threshold voltage of P4) and Vcc-Vtn. However, for leg 9 of the driver (transistors P1 and/or N1), since the pull-down code is zero, the electric path from leg 9 to node Vo is shut-off. As a result when the pad Vo switches, the internal node Vf charges up beyond Vcc and can eventually stabilize at Vcc+|Vtp|.

In addition, during the time when the node Vf charges up to stabilize at Vcc+|Vtp| level, if the signal on the pad node Vo switches from logical low level to logical high level, the signal on the pad node Vo will couple back to node Vf on leg 9 of the driver and will cause node Vf to overshoot much higher than Vcc+|Vtp| level before stabilizing back to Vcc+|Vtp|. As this internal node Vf charges beyond Vcc level, the devices connected to this node (P4 and N4) will experience voltage stress causing reliability failures.

In one embodiment, the logic unit 307 is implemented using XNOR (exclusive-NOR) and NAND logic gates to check the RCODE-impedance values for the transistors P1 and N1) from a compensation unit (not shown). In one embodiment, when the pull-up and pull-down RCODE are not balanced, the output 308 from XNOR and the NAND logic units in the logic unit 307 will cause the switch 201 to be enabled (i.e., turned on) for leg 9 of the pull-down transistor (N1) which causes the unbalance.

Referring back to the embodiments of FIGS. 2 and 3, to solve the problem discussed above with regards voltage stress causing reliability failures in the buffer 100 of FIG. 1, the switch 201 is coupled between nodes 207 and 208 such that the switch(s) 201 is parallel to the feedback capacitor(s) 202. By enabling the shunt path, i.e. enabling the switch 201, the internal node 208 Vf for leg 9 is always connected to the pad 207 and will not drift to Vcc+|Vtp|.

The following example is presented with reference to prior art FIG. 1 to show the technical effect of the switch 201 with regards to duty cycle inconsistencies in the signal at node Vo by the buffer 100. Consider a case without the switch 201 (e.g., as shown in prior art FIG. 1) during the initial transition of a signal on pad Vo after enabling the buffer 100 of FIG. 1. The voltage value of the internal Vf node has a direct effect on the initial signal transition duty-cycle of signal on the node Vo. Depending on whether the voltage on the node Vf is closer to Vcc or Vss (ground), the duty-cycle of the output signal on node Vo for the first signal transition can change. When the driver transistors are disabled (P1 and N1 are off) to tri-state the buffer 100 or when the buffer 100 is in receive mode (i.e., to receive a signal on node Vo), the internal node Vf is floating.

A floating Vf node will introduce a duty-cycle indeterminism for the initial transition of the signal on node Vo driven by the driver (transistors P1 and N1). Such indeterminism for the initial transition of the signal may cause a timing error. The duty-cycle may vary out of range based on the I/O protocol requirements as Vf node shifts from vss to vcc. For example, the duty cycle can change by about 5%-10% as the voltage on node Vf varies from Vcc to Vss.

Referring back to the embodiments of FIGS. 2 and 3, to solve the problem discussed above with regards to indeterminism for the initial transition of the signal on node Vo driven by the driver in the buffer 100 of FIG. 1, the switch 201 is coupled between nodes 207 and 208 such that the switch(s) 201 is parallel to the feedback capacitor(s) 202. In one embodiment, when the driver 301 is disabled which causes the logic unit 306 to enable the switch 201 (i.e., turn on the switch), the voltage on the node 208 Vf will follow the pad voltage on node 207 Vo. In such an embodiment, the internal node 208 Vf is always deterministic and the duty cycle of the very first transition of the signal on node 207 is deterministic.

Figure 4:
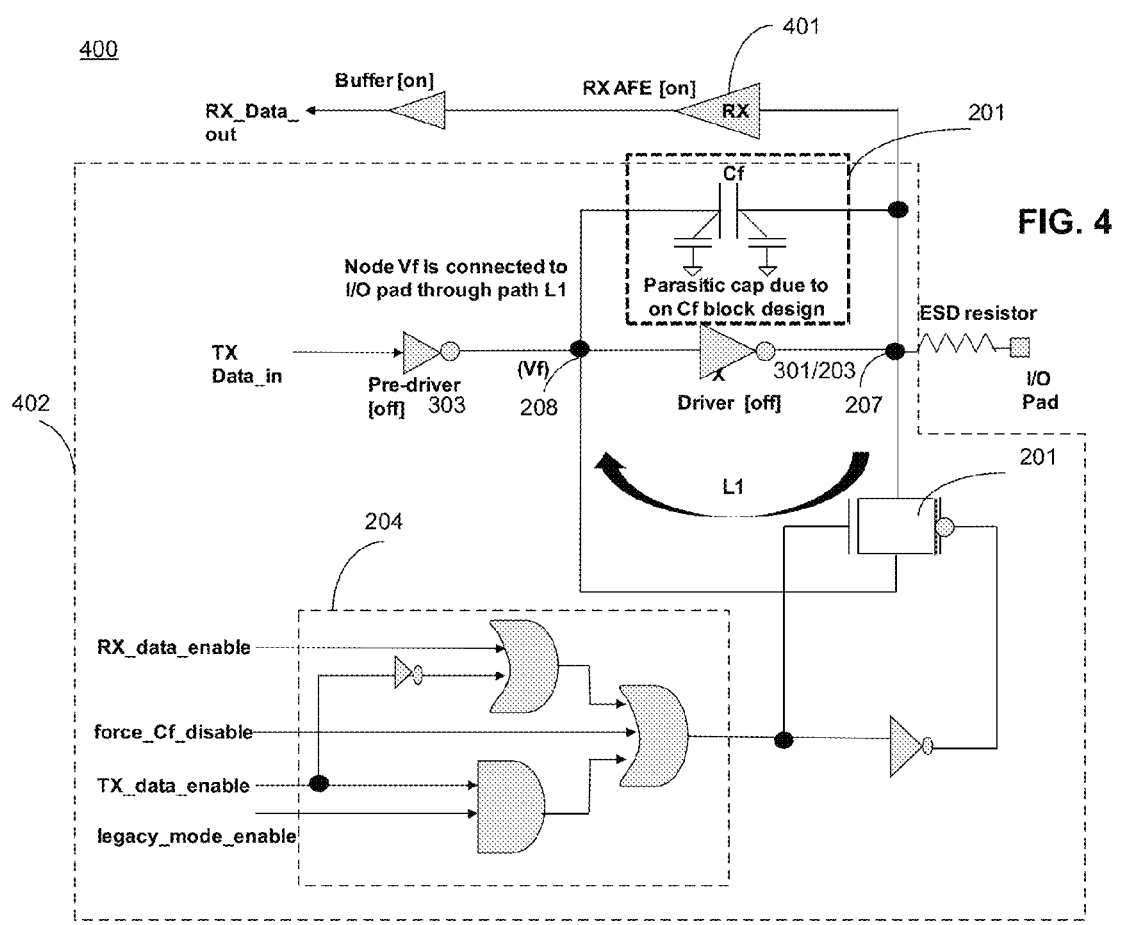
FIG. 4 is an input-output (I/O) buffer with circuit for controlling a switch to cancel electrical overstress and to make the duty cycle deterministic, according to one embodiment of the invention.

FIG. 4 is an input-output (I/O) buffer 400 with a logic unit for controlling the switch 201 to cancel electrical overstress on internal transistors coupled to the node 207 and to make the duty cycle deterministic at the output node 208, according to one embodiment of the invention. FIG. 4 is also a simplified version of FIG. 3 showing the control logic unit 204 to control the switch 201. In one embodiment, the I/O buffer 400 comprises a transmitter 402 and a receiver 401. The embodiment of FIG. 4 illustrates the case when the driver is off (i.e., tri-stated) and the receiver is on (i.e., receive mode). In such an embodiment, the switch 201 is turned on to short the capacitor 201 by electrically shorting the nodes 207 and 208. By shorting the capacitor, the stress on transistors connected to the node 208 is eliminated.

Figure 5:
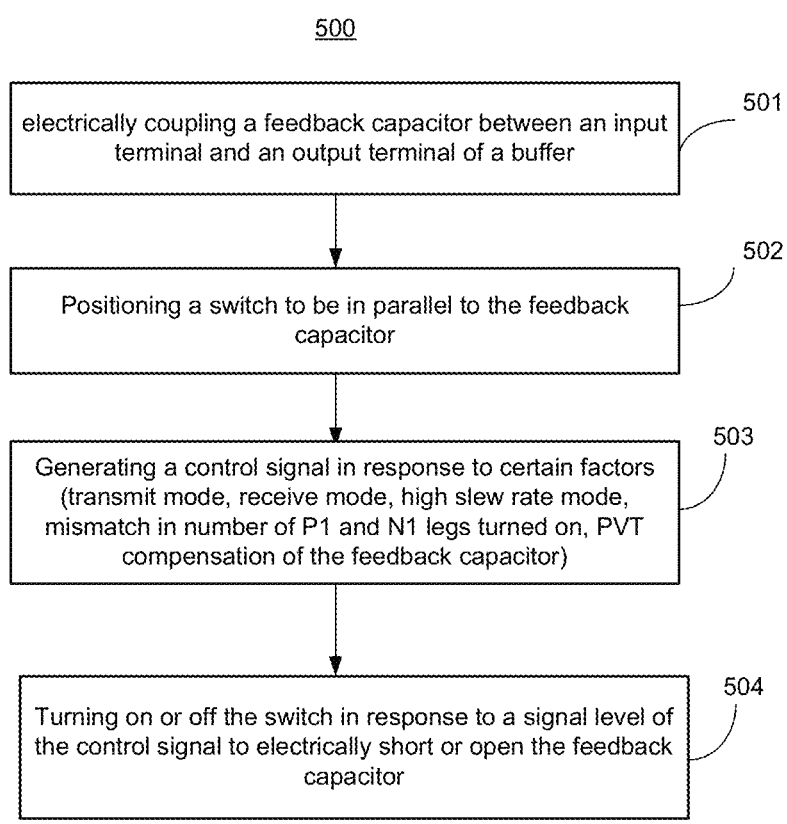
FIG. 5 is a method flowchart for improving the load independent buffer, according to one embodiment of the invention.

FIG. 5 is a method flowchart 500 for improving the load independent buffer, according to one embodiment of the invention. Although the blocks in the flowchart 500 are shown in a particular order, the order of the actions can be modified. Therefore, the illustrated embodiments can be performed in a different order, and some actions/blocks may be performed in parallel. Additionally, one or more actions/blocks can be omitted in various embodiments. The flow chart of FIG. 5 is illustrated with reference to the embodiments of FIG. 2-4.

At block 501, the feedback capacitor 202 is electrically coupled between the input terminal 208 and the output terminal 207 of the buffer 203. At block 502, a switch 201 is positioned to be in parallel to the feedback capacitor 202, wherein the switch comprises a plurality of switches (not shown), each of which is electrically parallel to a corresponding feedback capacitor of a plurality of feedback capacitors, and where each of the switches of the plurality of switches is coupled to pull-up P1 and pull-down N1 devices of a driver 301 of the buffer 203.

At block 503, the logic unit 204 generates a control signal 206 in response to certain factors. In one embodiment, these certain factors include whether the buffer 203 is in transmit mode, whether the buffer 203 is configured to operate at a higher speed requiring faster slew rate on node 207, and whether the I/O (which comprises the buffer 203 and a receiver 401) is in receive mode.

At block 504, the switch 201 is turned on in response to a level of a control signal 206 to electrically short the feedback capacitor (i.e., short nodes 207 and 208), wherein the switch 201 causes a deterministic voltage level on the input terminal 207. In one embodiment, the method comprises turning on or off the switch 201 from the plurality of switches in response to determining a difference in a number of the pull-up P1 and pull-down N1 devices turned on or off.

Figure 6A:
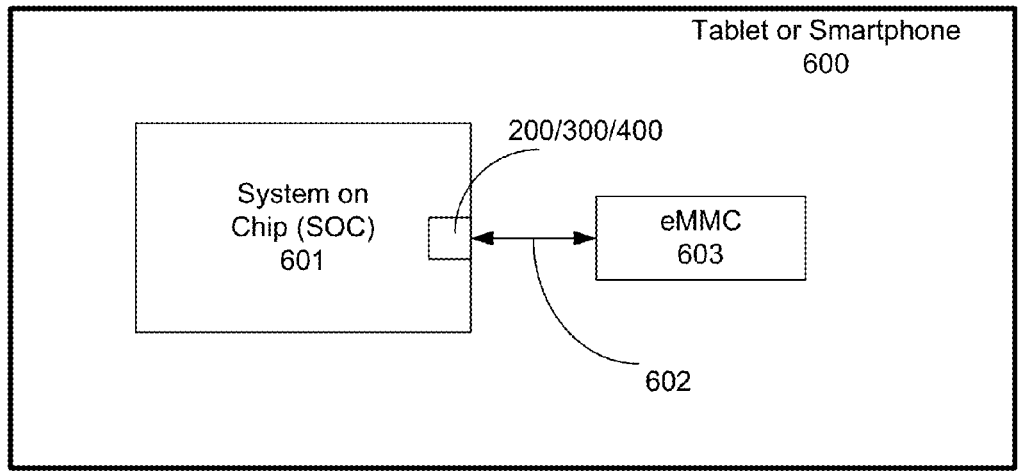
FIG. 6A is a smart device (e.g., tablet, smart phone) with the load independent buffer communicatively coupled to an embedded multimedia card (eMMC), according to one embodiment of the invention.

FIG. 6A is a smart device 600 (e.g., tablet, smart phone) with the load independent buffer 200 communicatively coupled to an embedded multimedia card (eMMC) 603, according to one embodiment of the invention. The eMMC 603 requires a specific range of slew rate of a signal driven from the transmitter 200 on the communication link 602. In general eMMC are smaller in size than NAND flash memories and thus the load seen by the transmitter 200 is less (e.g., by 3 times) than the load (Cload) seen by the same transmitter 200 driving to a NAND flash memory. In one embodiment, the load independent buffer 200/300/400 discussed herein provides the required slew rate for the eMMC without overstressing any of the internal transistors and removes any initial indeterminism to the duty cycle of the signal driven out by the buffer 200/300/400 on node Vo.

Figure 6B:
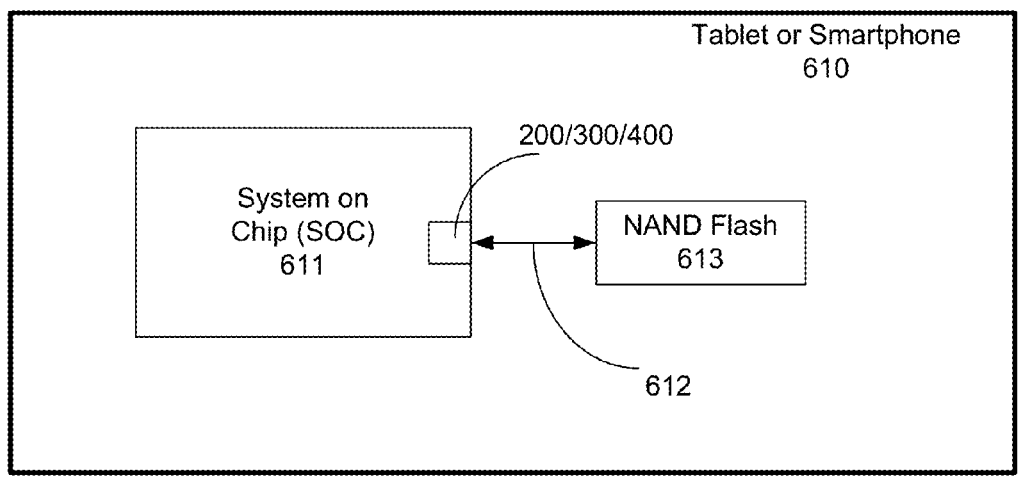
FIG. 6B is a smart device (e.g., tablet, smart phone) with the load independent buffer communicatively coupled to an NAND flash memory, according to one embodiment of the invention.

FIG. 6B is a smart device 610 (e.g., tablet, smart phone) with the load independent buffer 200 communicatively coupled to NAND flash memory 613, according to one embodiment of the invention. FIG. 6B is similar to FIG. 6A except that the eMMC 603 is replaced with a NAND flash memory 613. As mentioned above, NAND flash memories are larger in size than eMMC, and so the transmitter 200 in 610 sees a much larger load (e.g., 3 times more) than the transmitter 200 in 600. A larger load generally slows down the slew rate of the signal on the communication link 612.

In one embodiment, the same load independent buffer 200/300/400 as used in FIG. 6A provides the required slew rate, which may be 3 times faster than the slew rate requirements for the eMMC, for the NAND flash memory without over-stressing any of the internal transistors. In the embodiments of FIG. 6A and FIG. 6B, the same system on chip processors are used to interface with an eMMC and with a NAND flash memory. While the embodiments of FIG. 6A and FIG. 6B discuss eMMC and NAND flash memories, any load may be used instead of eMMC and NAND flash memories to provide the required slew rate from by the load independent buffer 200/300/400.

Figure 7:
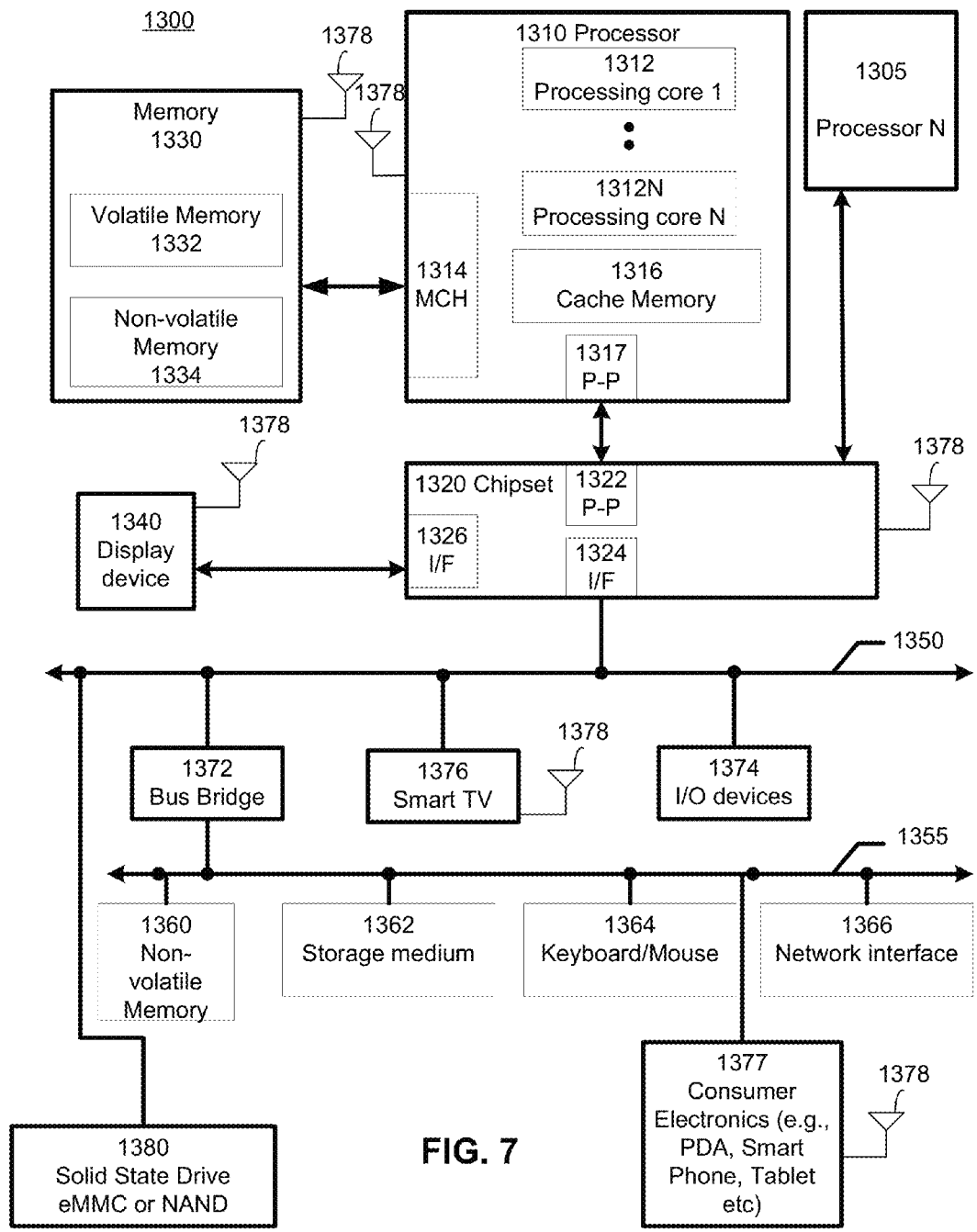
FIG. 7 is a system level diagram comprising a processor with the improved load independent buffer, according to one embodiment of the invention.

FIG. 7 is a system level diagram comprising a processor for improving the load independent buffer, according to one embodiment of the invention. FIG. 7 also includes a machine-readable storage medium to execute computer readable instructions to perform the methods of various embodiments. Elements of embodiments are also provided as a machine-readable medium for storing the computer-executable instructions (e.g., instructions to implement the flowchart of FIG. 5). The machine-readable medium may include, but is not limited to, flash memory, optical disks, CD-ROMs, DVD ROMs, RAMs, EPROMs, EEPROMs, magnetic or optical cards, or other type of machine-readable media suitable for storing electronic or computer-executable instructions. For example, embodiments of the invention may be downloaded as a computer program (e.g., BIOS) which may be transferred from a remote computer (e.g., a server) to a requesting computer (e.g., a client) by way of data signals via a communication link (e.g., a modem or network connection).

In one embodiment, the system 1300 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In another embodiment, the system 1300 implements the methods disclosed herein and may be a system on a chip (SOC) system.

In one embodiment, the load independent buffer 200/300/400 can be used for any I/O interface of the system of FIG. 7.

In one embodiment, the processor 1310 has one or more processing cores 1312 and 1312N, where 1312N represents the Nth processor core inside the processor 1310 where N is a positive integer. In one embodiment, the system 1300 includes multiple processors including processors 1310 and 1305, where processor 1305 has logic similar or identical to logic of processor 1310. In one embodiment, the system 1300 includes multiple processors including processors 1310 and 1305 such that processor 1305 has logic that is completely independent from the logic of processor 1310. In such an embodiment, a multi-package system 1300 is a heterogeneous multi-package system because the processors 1305 and 1310 have different logic units. In one embodiment, the processing core 1312 includes, but is not limited to, pre-fetch logic to fetch instructions, decode logic to decode the instructions, execution logic to execute instructions and the like. In one embodiment, the processor 1310 has a cache memory 1316 to cache instructions and/or data of the system 1300. In another embodiment of the invention, the cache memory 1316 includes level one, level two and level three, cache memory, or any other configuration of the cache memory within the processor 1310.

In one embodiment, processor 1310 includes a memory control hub (MCH) 1314, which is operable to perform functions that enable the processor 1310 to access and communicate with a memory 1330 that includes a volatile memory 1332 and/or a non-volatile memory 1334. In one embodiment, the memory control hub (MCH) 1314 is positioned outside of the processor 1310 as an independent integrated circuit.

In one embodiment, the processor 1310 is operable to communicate with the memory 1330 and a chipset 1320. In one embodiment, the chipset 1320 is coupled to a SSD 1380 via a SATA bus 1350.

In one embodiment, the processor 1310 is also coupled to a wireless antenna 1378 to communicate with any device configured to transmit and/or receive wireless signals. In one embodiment, the wireless antenna interface 1378 operates in accordance with, but is not limited to, the IEEE 802.11 standard and its related family, HomePlug AV (HPAV), Ultra Wide Band (UWB), Bluetooth, WiMAX, or any form of wireless communication protocol.

In one embodiment, the volatile memory 1332 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 1334 includes, but is not limited to, flash memory (e.g., NAND, NOR), phase change memory (PCM), read-only memory (ROM), electrically erasable programmable read-only memory (EEPROM), or any other type of non-volatile memory device.

The memory 1330 stores information and instructions to be executed by the processor 1310. In one embodiment, memory 1330 may also store temporary variables or other intermediate information while the processor 1310 is executing instructions. In one embodiment, chipset 1320 connects with processor 1310 via Point-to-Point (PtP or P-P) interfaces 1317 and 1322. In one embodiment, chipset 1320 enables processor 1310 to connect to other modules in the system 1300. In one embodiment of the invention, interfaces 1317 and 1322 operate in accordance with a PtP communication protocol such as the INTEL® QuickPath Interconnect (QPI) or the like.

In one embodiment, the chipset 1320 is operable to communicate with the processor 1310, 1305, display device 1340, and other devices 1372, 1376, 1374, 1360, 1362, 1364, 1366, 1377, etc. In one embodiment, the chipset 1320 is also coupled to a wireless antenna 1378 to communicate with any device configured to transmit and/or receive wireless signals.

In one embodiment, chipset 1320 connects to a display device 1340 via an interface 1326. In one embodiment, the display 1340 includes, but is not limited to, liquid crystal display (LCD), plasma, cathode ray tube (CRT) display, touch pad, or any other form of visual display device. In one embodiment of the invention, processor 1310 and chipset 1320 are merged into a single SOC. In addition, the chipset 1320 connects to one or more buses 1350 and 1355 that interconnect various modules 1374, 1360, 1362, 1364, and 1366. In one embodiment, buses 1350 and 1355 may be interconnected together via a bus bridge 1372 if there is a mismatch in bus speed or communication protocol. In one embodiment, chipset 1320 couples with, but is not limited to, a non-volatile memory 1360, a mass storage device(s) 1362, a keyboard/mouse 1364, and a network interface 1366 via interface 1324, smart TV 1376, consumer electronics 1377, etc.

In one embodiment, the mass storage device 1362 includes, but is not limited to, a solid state drive, a hard disk drive, a universal serial bus flash memory drive, or any other form of computer data storage medium. In one embodiment, network interface 1366 is implemented by any type of well known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, HomePlug AV (HPAV), Ultra Wide Band (UWB), Bluetooth, WiMAX, or any form of wireless communication protocol.

While the modules shown in FIG. 7 are depicted as separate blocks within the system 1300, the functions performed by some of these blocks may be integrated within a single semiconductor circuit or may be implemented using two or more separate integrated circuits. For example, although the cache memory 1316 is depicted as a separate block within the processor 1310, the cache memory 1316 can be incorporated into the processor core 1312 respectively. In one embodiment, the system 1300 may include more than one processor/processing core in another embodiment of the invention.

Reference in the specification to "embodiment," "one embodiment," "some embodiments," or "other embodiments" means that a particular feature, structure, or characteristic described in connection with the embodiments is included in at least some embodiments, but not necessarily all embodiments. The various appearances of "embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

While the invention has been described in conjunction with specific embodiments thereof, many alternatives, modifications and variations of such embodiments will be apparent to those of ordinary skill in the art in light of the foregoing description. The embodiments of the invention are intended to embrace all such alternatives, modifications, and variations as to fall within the broad scope of the appended claims.

We claim:

1. An apparatus comprising:
  an input-output (I/O) transmitter and receiver circuit to couple to a terminal of bi-directional signal line, comprising:
    a feedback capacitor electrically coupled between an input terminal and an output terminal of a transmit buffer, wherein the output terminal of the transmit buffer is coupled to the terminal of the bi-directional signal line;
    a switch electrically parallel to the feedback capacitor;
    a receiver circuit having an input electrically coupled to the terminal of the bi-directional signal line; and
    a logic unit electrically coupled to the switch, wherein the logic unit is operable to cause the switch to electrically short the feedback capacitor in response to determining whether the transmit buffer is driving data on the terminal of the bi-directional signal line, or whether a receiver is enabled to receive data from the terminal of the bi-directional signal line.

2. The apparatus of claim 1, wherein the feedback capacitor is coupled to a P-transistor, wherein the P-transistor is coupled to a gate of a pull-up device of the transmit buffer,
  wherein the feedback capacitor is coupled to a N-transistor, wherein the N-transistor is coupled to a gate of a pull-down device of the transmit buffer,
  wherein the input terminal couples to a source or drain terminal of the P-transistor and the N-transistor, and
  wherein the terminal of the bi-directional signal line couples to a load.

3. The apparatus of claim 1, wherein the transmit buffer comprises a plurality of drivers, and wherein the feedback capacitor comprises a plurality of feedback capacitors coupled between the input and output terminals of the transmit buffer.

4. The apparatus of claim 3, wherein the switch comprises a plurality of switches, each of which is electrically parallel to a corresponding feedback capacitor of the plurality of feedback capacitors, wherein a control signal comprises a plurality of control signals, and wherein each control signal of the plurality of control signals is operable to cause a corresponding switch from the plurality of switches to turn on or off according to a signal level of its respective control signal from the logic unit.

5. The apparatus of claim 1, wherein the switch comprises a plurality of switches, each of which is electrically parallel to a corresponding feedback capacitor of a plurality of feedback capacitors, and each of which is coupled to pull-up and pull-down devices of the transmit buffer.

6. The apparatus of claim 1, wherein the transmit buffer is operable to increase a slew rate at the output terminal.

7. A system comprising:
  an embedded multimedia card (eMMC) unit; and
  a processor with a bi-directional input-output (I/O) interface, wherein the bi-directional I/O interface coupled to the eMMC unit, the bi-directional I/O interface comprising:
    a feedback capacitor electrically coupled between an input terminal and an output terminal of a transmit buffer of the I/O interface circuit, the output terminal of the transmit buffer coupled to a bi-directional signal line of the bi-directional I/O interface; and
    a switch electrically parallel to the feedback capacitor and operable to electrically short the feedback capacitor in response to a control signal that indicates the bi-directional I/O interface circuit is in a transmit mode and not a receive mode;
    a received circuit having an input coupled to the output terminal of the transmit buffer and the bi-directional signal line of the bi-directional I/O interface.

8. The system of claim 7, wherein the eMMC unit and the processor are positioned inside a tablet computing device or a smart-phone.

9. The system of claim 8, wherein the feedback capacitor is coupled to a N-transistor, wherein the N-transistor is coupled to a gate of a pull-down device of the buffer,
  wherein the input terminal couples to a source or drain terminal of the P-transistor and the N-transistor, and
  wherein the output terminal couples to a load.

10. The system of claim 7, wherein the feedback capacitor is coupled to a P-transistor, wherein the P-transistor is coupled to a gate of a pull-up device of the buffer.

11. The system of claim 7, wherein the transmit buffer comprises a plurality of drivers, and wherein the feedback capacitor comprises a plurality of feedback capacitors coupled between the input and output terminals of the transmit buffer.

12. The system of claim 7, wherein the processor further comprises a logic unit operable to generate the control signal.

13. The system of claim 12, wherein the switch comprises a plurality of switches, each of which is electrically parallel to a corresponding feedback capacitor of the plurality of feedback capacitors, wherein the control signal comprises a plurality of control signals generated by the logic unit, and wherein each control signal of the plurality of control signals is operable to cause a corresponding switch from the plurality of switches to turn on or off according to a signal level of its respective control signal.

14. The system of claim 12, wherein the switch comprises a plurality of switches, each of which is positioned to be parallel to a corresponding feedback capacitor of a plurality of feedback capacitors, and each of which is coupled to pull-up and pull-down devices of the transmit buffer, wherein the logic unit is operable to turn on or off a switch from the plurality of switches in response to determining a difference in a number of the pull-up and pull-down devices turned on or off.

15. A method comprising:
electrically coupling a feedback capacitor between an input terminal and an output terminal of a transmit buffer of a bi-directional I/O circuit when the bi-directional I/O circuit is transmitting, wherein the electrically coupling comprising opening a switch along a signal path in parallel with the feedback capacitor; and
electrically shorting by the switch the signal path in parallel with the feedback capacitor in response to a control signal that indicates the bi-directional I/O circuit is in a receive mode.

16. The method of claim 15 further comprises:
generating the control signal, wherein the switch comprises a plurality of switches, each of which is electrically parallel to a corresponding feedback capacitor of a plurality of feedback capacitors, and each of which is coupled to pull-up and pull-down devices of the transmit buffer; and
turning on or off a switch from the plurality of switches in response to determining a difference in a number of the pull-up and pull-down devices turned on or off.

* * * * *